(12) United States Patent
Tantiwong et al.

(10) Patent No.: US 9,287,147 B2
(45) Date of Patent: Mar. 15, 2016

(54) SUBSTRATE SUPPORT WITH ADVANCED EDGE CONTROL PROVISIONS

(71) Applicants: Kyle Tantiwong, San Jose, CA (US); Samer Banna, San Jose, CA (US)

(72) Inventors: Kyle Tantiwong, San Jose, CA (US); Samer Banna, San Jose, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 356 days.

(21) Appl. No.: 13/827,687

(22) Filed: Mar. 14, 2013

(65) Prior Publication Data

US 2014/0265089 A1 Sep. 18, 2014

(51) Int. Cl.
*H01L 21/683* (2006.01)
*H01L 21/67* (2006.01)
*H01L 21/687* (2006.01)

(52) U.S. Cl.
CPC ...... *H01L 21/67109* (2013.01); *H01L 21/6831* (2013.01); *H01L 21/68735* (2013.01); *H01L 21/68785* (2013.01)

(58) Field of Classification Search
CPC ............ H01L 21/683; H01L 21/68785; H01L 21/68735; H01L 21/6831
USPC ............................................... 269/14, 289 R
See application file for complete search history.

(56) References Cited

U.S. PATENT DOCUMENTS

| | | | |
|---|---|---|---|
| 6,120,608 A * | 9/2000 | Shendon | C23C 16/4586 118/50 |
| 2003/0114087 A1* | 6/2003 | Duboust | B23H 5/08 451/41 |
| 2003/0155079 A1 | 8/2003 | Bailey et al. | |
| 2003/0230551 A1 | 12/2003 | Kagoshima et al. | |
| 2004/0061499 A1 | 4/2004 | Stocker | |
| 2004/0185670 A1 | 9/2004 | Hamelin et al. | |
| 2004/0195216 A1 | 10/2004 | Strang | |
| 2004/0261721 A1 | 12/2004 | Steger | |
| 2007/0204797 A1* | 9/2007 | Fischer | 118/723 R |
| 2007/0207706 A1* | 9/2007 | Takahashi | 451/28 |
| 2007/0224817 A1* | 9/2007 | Honda et al. | 438/689 |
| 2010/0176086 A1* | 7/2010 | Iwata | 216/71 |
| 2012/0273134 A1* | 11/2012 | Sexton | B08B 7/0035 156/345.33 |

* cited by examiner

*Primary Examiner* — Lee D Wilson
*Assistant Examiner* — Joel Crandall
(74) *Attorney, Agent, or Firm* — Patterson & Sheridan, LLP

(57) ABSTRACT

Embodiments of the present invention generally provide an apparatus with a recess and a cavity formed therein for future hardware retrofit and uniformity enhancement and methods for controlling the same. In one embodiment, a substrate support includes a supporting body having an outer wall, a ground path disposed against and bounding the outer wall of the supporting body, a mounting plate coupled to a lower surface of the supporting body, wherein the mounting plate includes a lip extending outward from the mounting plate defining an upper surface; and a recess formed at a perimeter of the supporting body above the upper surface of the lip of the mounting plate, the recess lining on the ground path extending at least partially to the mounting plate.

20 Claims, 3 Drawing Sheets

SUBSTRATE SUPPORT WITH ADVANCED EDGE CONTROL PROVISIONS

BACKGROUND

1. Field

Embodiments of the present invention generally relate to apparatus and methods for supporting a semiconductor substrate during fabrication. More particularly, embodiments of the present invention relate to apparatus and method for controlling the apparatus with adjustable edge control provision.

2. Description of the Related Art

Electronic devices and integrated circuits commonly are fabricated by a series of process steps in which layers are deposited on a substrate and the deposited material is etched into desired patterns. The process steps commonly include physical vapor deposition (PVD), chemical vapor deposition (CVD), plasma enhanced CVD (PECVD), and other plasma processing. Specifically, a plasma process requires supplying a process gas mixture to a vacuum chamber, and applying electrical or electromagnetic power (RF power) to excite the process gas into a plasma state. The plasma decomposes the gas mixture into ion species that perform the desired deposition or etch processes.

One problem encountered with plasma processes is the difficulty associated with establishing uniform plasma density over the substrate surface during processing, which leads to non-uniform processing between the center and edge regions of the substrate. One reason for the difficulty in establishing uniform plasma density involves natural electrical, gas flow, RF delivery, grounding paths, and thermal skews due to asymmetry in the physical process chamber design. Such skews not only result in naturally, azimuthal, non-uniform plasma density, but also make it difficult to use other processing variables or "knobs" to control center-to-edge plasma uniformity.

Furthermore, additional space or mounting provisions within or around the plasma chamber are always desired for better uniformity control so that flexibility for future retrofit with different hardware sets may be increased when different issues or skew pattern are found. Insufficient space for future processing chamber retrofit may result in significant redesign when adding future hardware sets, thereby adversely increasing manufacture cost. Incompatibility of the existing and future (e.g., retrofit) chamber parts may also lose flexibility for minor chamber parts replacement or rearrangement, resulting in rigidity of the plasma chamber design which increases the difficulty for future hardware enhancement.

Therefore, a need exists for a plasma processing apparatus that improves electrical, gas flow, and thermal symmetry as well as providing flexibility for future hardware enhancements.

SUMMARY

Embodiments of the present invention generally provide an apparatus with a recess and a cavity formed therein for future hardware retrofit and uniformity enhancement and methods for controlling the same. In one embodiment, a substrate support includes a supporting body having an outer wall, a ground path disposed against and bounding the outer wall of the supporting body, a mounting plate coupled to a lower surface of the supporting body, wherein the mounting plate includes a lip extending outward from the mounting plate defining an upper surface; and a recess formed at a perimeter of the supporting body above the upper surface of the lip of the mounting plate, the recess lining on the ground path extending at least partially to the mounting plate.

In another embodiment, a substrate support includes a supporting body, a mounting plate coupled to the supporting body, and at least one cavity defined in the mounting plate extending at least partially into a main chassis coupled to the supporting body, wherein the cavity is formed in a position in the mounting plate outward from lift pins disposed in the mounting plate.

In yet another embodiment, a substrate support includes a supporting body, aground plate coupled to the supporting body, a mounting plate coupled to the ground plate, wherein the mounting plate has a lip extending outward from the mounting plate, defining a recess above the lip of the mounting plate circumscribing the supporting body and the ground plate and at least one cavity formed between the mounting plate and a main chassis coupled to the mounting plate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention provide a substrate support with advanced edge control provisions. The substrate support may also include additional space formed in the substrate support body to provide space for future hardware retrofit and uniformity enhancements. In one embodiment, the substrate support may have a recess formed at a perimeter of the substrate support. The recess may provide flexibility for retrofitting additional heating elements, cooling element. RF ground path and the like so as to improve edge profile control, therefore, improving control of temperature/gas distribution profile across the substrate support and the substrates being processed thereon. Additional cavities may be formed within the body of the substrate support for future use as needed to improve uniformity control across the substrate support and the substrates being processed thereon.

Figure 1:
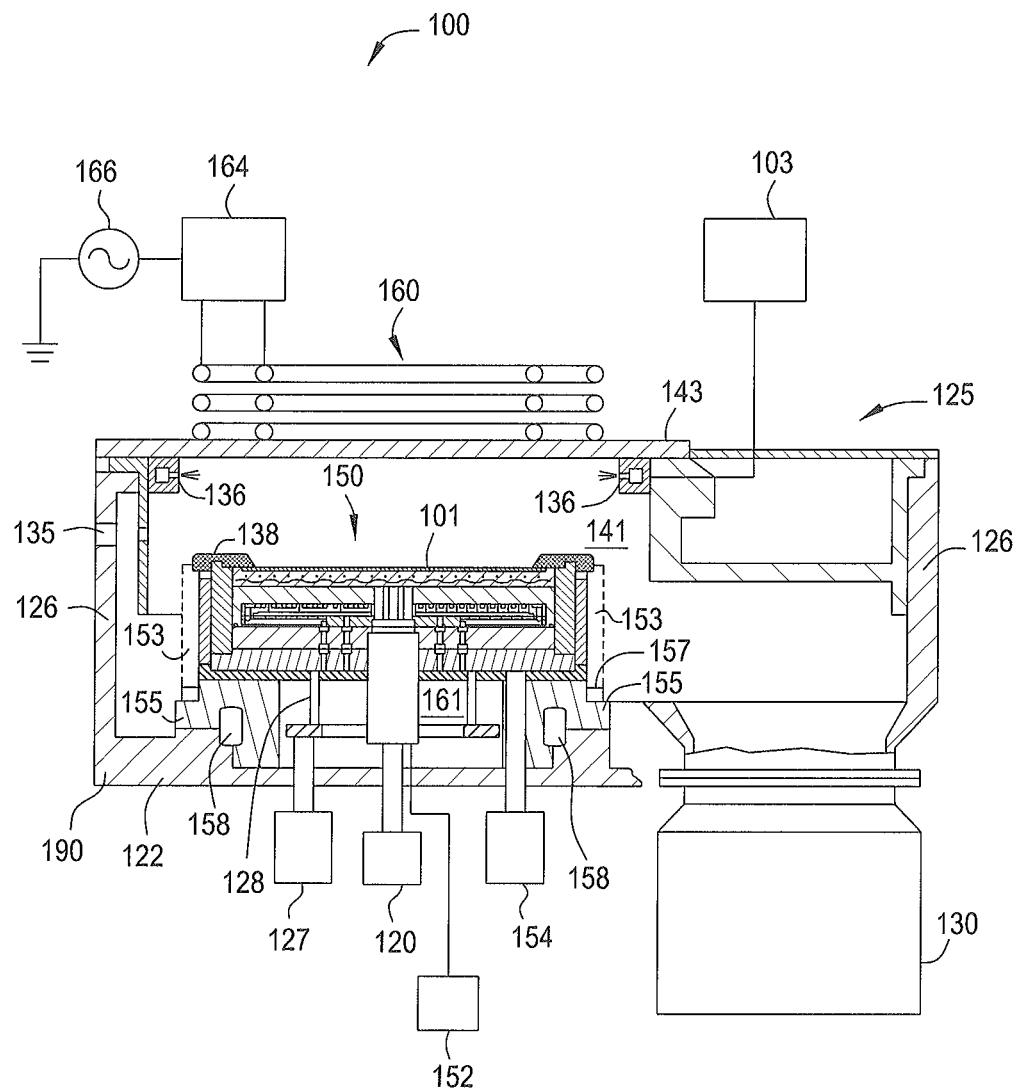
FIG. 1 is a schematic sectional view of a processing chamber according to one embodiment of the present invention.

FIG. 1 is a schematic sectional view of a processing chamber 100 according to one embodiment of the present invention. The processing chamber 100 includes a substrate support 150 with improved temperature/uniformity control according to embodiments of the present invention. The processing chamber 100 may be configured to process a variety of substrates, such as semiconductor substrates and reticles, and accommodating a variety of substrate sizes.

The processing chamber 100 includes a chamber body 125 defining a processing volume 141. The chamber body 125 may include a bottom 122, sidewalls 126 and a lid 143 disposed over the sidewalls 126. The bottom 122 may be part of a main chassis 190 adapted to couple to and the substrate support 150 within the processing volume 141. A slit valve opening 135 is formed through the sidewall 126 to allow passage of the substrates and substrate transfer mechanism (not shown). A vacuum pump 130 is in fluid communication with the processing volume 141 and configured to maintain a low pressure environment within the processing volume 141. A plurality of nozzles 136 are positioned around an edge region of the processing volume 141. The plurality of nozzles 136 may be connected to a gas delivery system 103 and configured to inject one or more processing gases to the processing volume 141.

The processing chamber 100 may also include an antenna assembly 160 for generating a plasma inside the processing volume 141. In one embodiment, the antenna assembly 160 is disposed outside the chamber lid 143. The antenna assembly 160 may be coupled to a radio-frequency (RF) plasma power source 166 through a matching network 164. In the embodiment of FIG. 1, the antenna assembly 160 includes one or more solenoidal interleaved coil antennas disposed coaxially. Alternatively, the antenna assembly 160 may be other suitable arrangement.

The substrate support 150 is disposed in the processing volume 141. The substrate support 150 supports a substrate 101 during processing. An edge ring 138 may be disposed around a periphery region of the substrate 101 during processing for substrate edge protection. A lift 127 is movable to engage lifting pins 128 that raise the substrate 101 above and lower the substrate 101 onto the substrate support 150. The substrate support 150 may be an electrostatic chuck coupled to a chucking power source 120 to secure the substrate 101 thereon. In one embodiment, the substrate support 150 includes one or more embedded heating elements coupled to a heating power source 152 for heating the substrate 101 during processing. A recess area 153 may be defined around circumference of the substrate support 150 to provide for future use. A RF ground path 157 may also be optionally installed in the recess 153 as needed that provides a low impedance RF return path as needed. A cavity 158 may be formed close or in a mounting plate included in the substrate support 150. The cavity 158 is generally an empty space which is sized to accommodate future enhancements to the substrate support 150, as further described below. The substrate support 150 also includes cooling channels connected to a cooling fluid source 154 to provide cooling or heating and adjusts temperature profile of the substrate 101 being processed.

Figure 2:
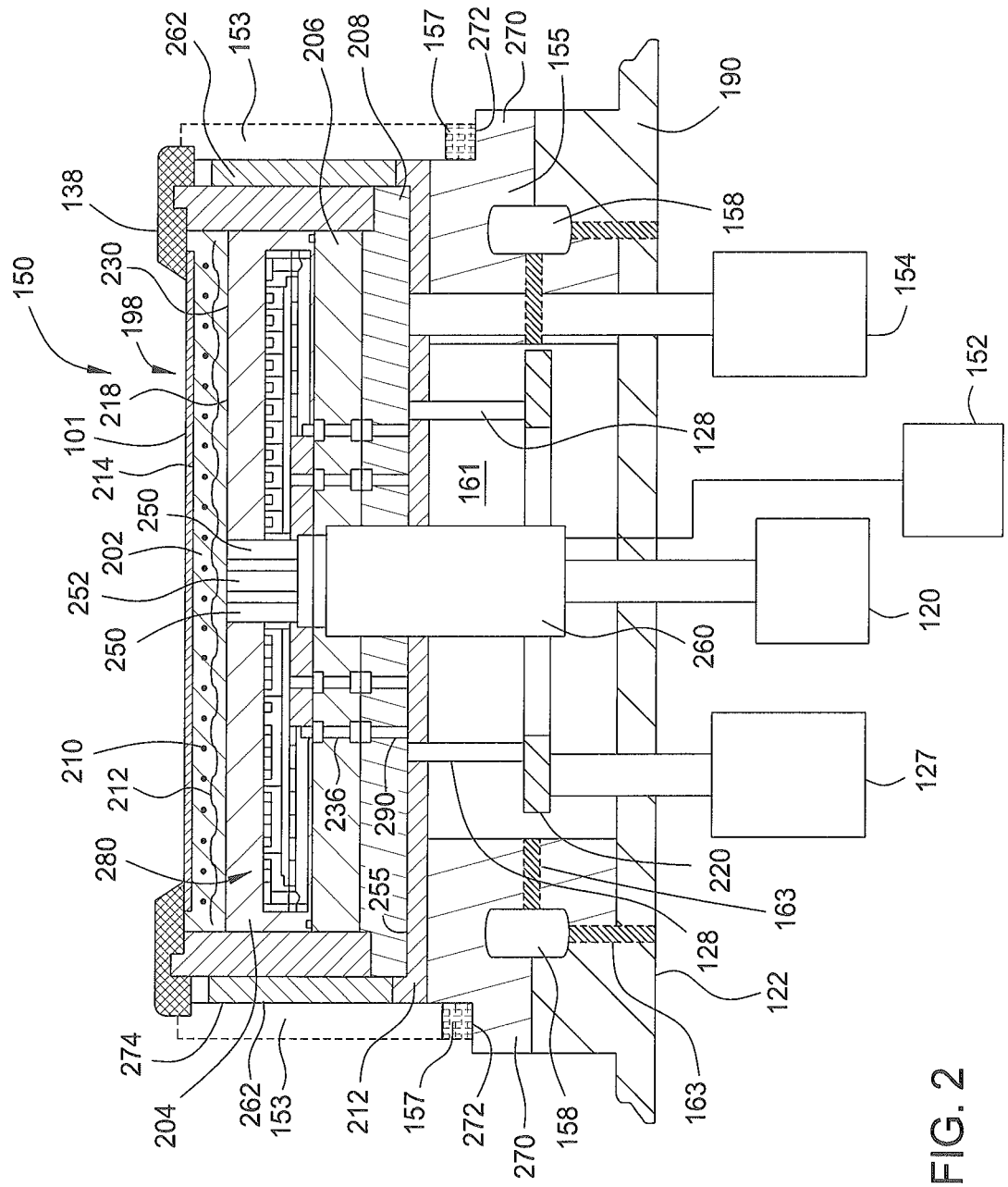
FIG. 2 is a sectional side view of a substrate support according to one embodiment of the present invention.

FIG. 2 is a sectional side view of the substrate support 150 according to one embodiment of the present invention. The substrate support 150 includes a supporting body 198 including a substrate supporting plate 202, a cooling plate 204, an inlet/outlet plate 206 and a base plate 208. The substrate supporting plate 202 includes an upper side 214 for supporting a substrate 101 disposed thereon. The substrate supporting plate 202 contacts the substrate 101 being processed, thus providing temperature control to the substrate 101, and also includes a mechanism to secure the substrate 110 disposed thereon. The cooling plate 204 is attached to a lower side 218 of the substrate supporting plate 202. The cooling plate 204 is configured to provide cooling or heating to the substrate supporting plate 202 thus enhancing temperature control in the substrate supporting plate 202. In one embodiment, the cooling plate 204 includes parallel cooling paths to provide uniform cooling to the substrate supporting plate 202. The inlet/outlet plate 206 is coupled to a bottom of the cooling plate 204 to facilitate transferring cooling fluid through the cooling paths formed in the inlet/outlet plate 206. The base plate 208 is coupled to the main chassis 190 and is configured to support the substrate supporting plate 202, the cooling plate 204 and the inlet/outlet plate 206.

The substrate supporting plate 202 may be a substantially planar disk having a substrate supporting surface formed on the upper side 214. The substrate supporting plate 202 may be formed from dielectric material, for example from aluminum oxide or yttrium containing materials. One or more heating elements 210 may be embedded in the substrate supporting plate 202 to heat the substrate support 150 and substrate 101 disposed thereon. The one or more heating elements 210 may be resistive heating elements. In one embodiment, the heating elements 210 may be independently controlled and form two or more heating zones to achieve desired temperature profile, for example, uniform temperature profile or a temperature gradient across the upper side 214 and the substrate 101 being processed thereon. In one embodiment, the one or more heating elements 210 form concentric heating zones. According to one embodiment, the one or more heating elements 210 form four concentric heating zones that are independently adjustable relative to each other.

The substrate supporting plate 202 may also include an electrode 212. The electrode 212 may be connected to the chucking power source 120 to secure the substrate 110 by electrostatic force. In one embodiment, the electrode 212 may include one or more conductive meshes embedded in the substrate supporting plate 202.

The cooling plate 204 further includes a diffuser 280 disposed therein. The cooling plate 204 may be a disk formed from a thermal conductive material, for example a metal, such as aluminum or stainless steel. The cooling plate 204 has an upper surface 230 that is attached to the lower side 218 of the substrate supporting plate 202 by solid contact to provide heat exchange with the substrate supporting plate 202. In one embodiment, the upper surface 230 of the cooling plate 204 and the lower side 218 of the substrate supporting plate 202 may be bonded by adhesive.

The diffuser 280 in the cooling plate 204 forms a plurality of cooling paths for circulating a cooling fluid (or a heated transfer fluid) from a cooling fluid source to and from the cooling plate 204. The inlet/outlet plate 206 is disposed below the diffuser 280 opposite the cooling plate 204. The inlet/outlet plate 206 includes a plurality of channels 236 connecting to the cooling path in the diffuser 280 for supplying the cooling fluid into and out of the cooling plate 204. The plurality of channels 236 may be distributed, for example symmetrically, across the inlet/outlet plate 206 to improve uniformity. The base plate 208 further includes a plurality of channels 290 aligning with the plurality of channels 236 in the inlet/outlet plate 206. The cooling plate 204, the diffuser 280, the inlet/outlet plate 206 and the base plate 208 may be joined together such that the fluid paths and the channels 236 are aligned together to provide fluid communication from and to the cooling fluid source 154.

A ground plate 212 is coupled to a lower surface 255 of the base plate 208. The ground plate 212 is also coupled to the base plate 208 supported by a mounting plate 155. The ground plate 212 is fabricated from an electrically conductive material that provides an RF conductive path between the electrode disposed in the substrate support plate 202 and ground.

The mounting plate 155 is disposed below the ground plate 212 and rests on the main chassis 190 formed as part of the bottom 122 of the processing chamber 100. The mounting plate 155 may further include a hollow portion 161 that accommodates a lift pin plate 220 utilized to displace the lift pins 128 to space the substrate 101 from the substrate support 150 when the substrate 101 is transferred into or out of the processing chamber 100. In one embodiment, the substrate support 150 includes at least three or more lift pin openings (only 2 of which are shown) formed through the substrate supporting plate 202, the cooling plate 204, the inlet/outlet plate 206 and the base plate 208 for receiving lift pins 128. The cavity 158 may be formed between the mounting plate 155 and the main chassis 190. The cavity is formed outward from the lift pins 128 beyond the hollow portion 161 formed in the mounting plate 155. At least one removable plug 163 may be formed in the mounting plate 155 connecting to the cavity 158. The plug 163 may be removed from the mounting plate 155 to facilitate future routing of power, such as installing or connecting wires, power lines, gas lines, or other suitable connection mechanisms, with elements disposed in the cavity 158, if necessary, for future use. The cavity 158 may also formed inner from the ground path 262 in a vertical direction circumscribing the supporting body 198. Details regarding the cavity 158 will be further discussed below with referenced to FIG. 3.

The substrate support 150 may also include a central shaft 260 having an inner volume to accommodate leads to power sources and/or controller. In one embodiment, the cooling plate 204 may include a plurality of heating power openings 250 configured to receive leads to the heating elements 210 in the substrate supporting plate 202. The cooling plate 204 may also include a chucking power opening 252 configured to receive a lead to the electrode 212. The heating power openings 250 and the chucking power openings 252 may be through holes formed near a central region of the cooling plate 204.

A ground path 262 may be disposed around a perimeter of the substrate support 150 (or the supporting body 198) circumscribing the cooling plate 204, the inlet/outlet plate 206 and a portion of the base plate 208 for forming RF return or ground path in the processing chamber 100 and forms the inner boundary of the recess 153. The ground path 262 is formed around the substrate support 150 for plasma confinement so as to maintain available pumping area. The ground path 262 may be fabricated from titanium, aluminum, stainless steel, beryllium copper, a material coated with a conductive metallic coating, or other suitable RF conducting material. The recess 153 is bounded by an outer wall 310 of the ground path 262 radially outward of the perimeter of the substrate support 150 (or the supporting body 198). An additional ground path 157 may be optionally disposed in the recess 153 as needed for future use. Details regarding the additional ground path 157 and the recess 153 are formed will be further discussed below with referenced to FIG. 3.

Figure 3:
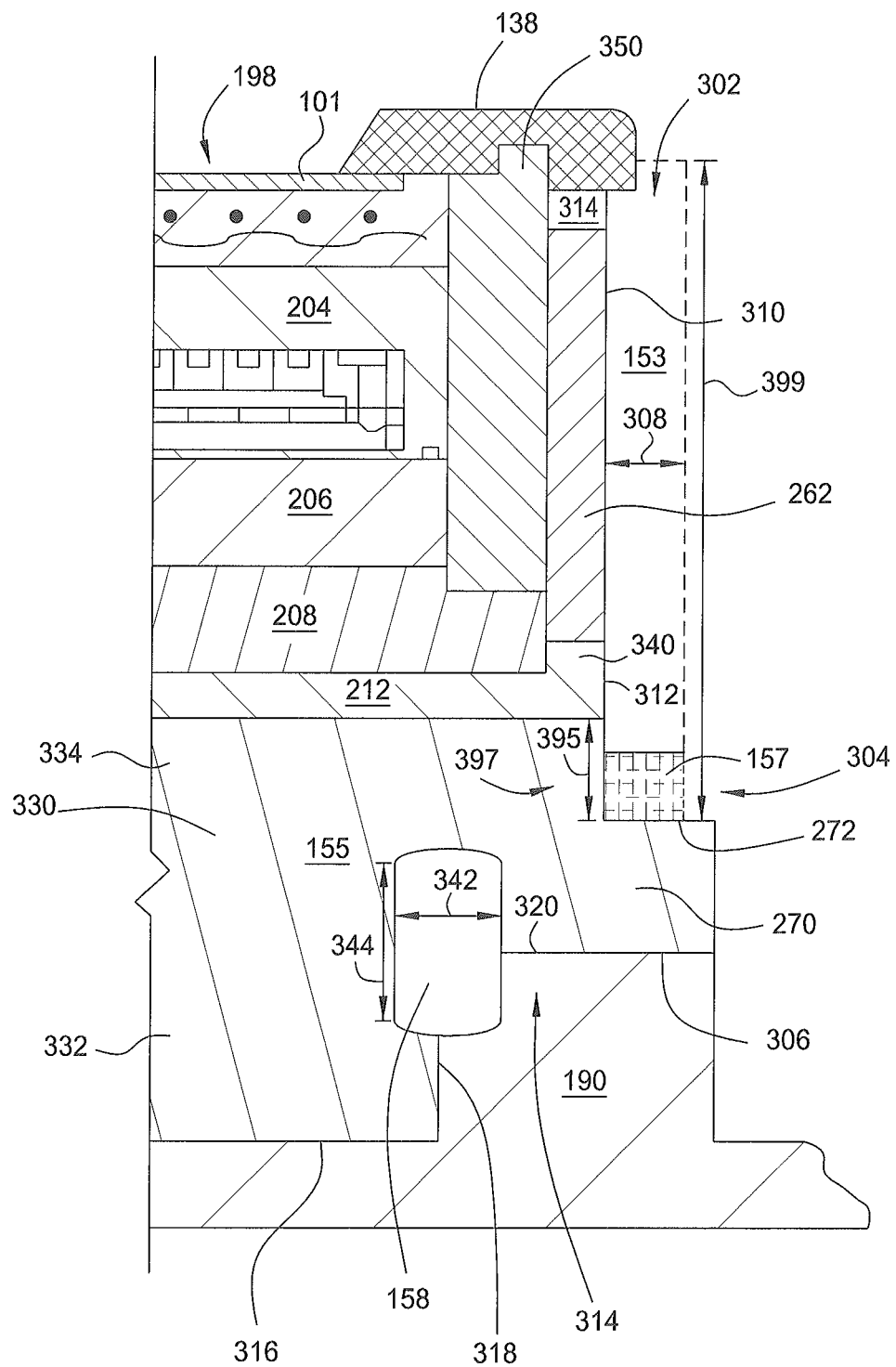
FIG. 3 is an enlarged partial sectional view of the substrate support of FIG. 2.

FIG. 3 is an enlarged partial sectional view of the substrate support 150 of FIG. 2. The ground path 262 is disposed around the perimeter of the substrate support 150 (or the supporting body 198) circumscribing the cooling plate 204, the inlet/outlet plate 206 and a portion of the base plate 208 above a step 340 defining by an outer wall 312 of the ground plate 212. A liner 350 may be disposed between the ground path 262 and the cooling plate 204, the inlet/outlet plate 206 and the base plate 208 for insulation (or between the ground path or an outer wall defined by the supporting body 198). The liner 350 is typically fabricated from ceramic materials. The dimension of the ground path 262 is sized to align and mate with the dimension of the step 340 of the ground plate 212 so that the ground path 262 may securely sit on the step 340. A gap 314 may be optionally defined below the edge ring 138 and above the ground path 262 as needed to provide flexibility of retrofitting ground path 262 with different sizes or dimensions as needed.

The mounting plate 155 may have an upper portion 330 and a lower portion 332. The upper portion 330 has a lip 270 extending from a body 334 of the mounting plate 155. The lip 270 along with the outer walls 312, 310 of the ground plate 212, the ground path 262 and a portion 397 of the mounting plate 155 collectively define the recess 153 at the perimeter of the substrate support 150 (or the supporting body 198). The portion 397 of the mounting plate 155 collectively defining the recess 153 above the upper surface 272 of the lip 270 has a length 395 between about 5 mm and about 20 mm. The recess 153 may have a width 308 between about 5 mm and about 30 mm which may be the same as the dimension of the lip 270 extending from the mounting plate 155. The recess 153 may have a height 399 between about 100 and about 195 mm lining on the outer wall 310, 312 of the ground path 262, the ground plate 212 and the portion 397 of the mounting plate 155. The recess 153 may have an upper part 302 and a lower part 304. The lower part 304 of the recess 153 may allow the additional RF ground path 157 to be disposed therein above an upper surface 272 of the lip 270 as needed. The main benefit of the additional RF ground path 157 is to maintain a concentric ground path, while allocating additional space in the recess 153 needed for future hardware enhancements to further control substrate edge uniformity. Furthermore, the additional RF ground path 157 may be optionally disposed therein to meet different process requirements or different future arrangements of the substrate support 150. In one embodiment, the lower part 304 may have a height between about 25 percent and about 95 percent from the total height 399 of the recess 153.

The recess 153 defined around the perimeter of the substrate support 150 (or the supporting body 198) preserve an additional space for future installation of different hardware sets as needed without significantly rearrangement or redesign of the substrate support 150. The recess 153 may allow different configurations, sizes, dimensions, and materials of RF power electrodes, ground path, heating elements, cooling elements, electrodes, various light sources or any other suitable hardware to be installed therein without changing the existing architecture of the substrate support 150. The recess 153 provides flexibility for the substrate support 150 to be retrofitted or rearranged in any manners without total replacement of the existing parts. Additional hardware sets positioned in the recess 153 may improve edge profile control, temperature/gas distribution profile and RF power or plasma distribution across the substrate support 150 as well as the substrate 101 disposed thereon being processed.

The lower portion 332 of the mounting plate 155 has an upper surface 320 defining a bottom 306 of the lip 270 and a lower surface 316 in contact with the main chassis 190. The upper surface 320 and the lower surface 316 is connected by a vertical wall 318, collectively defining a step 314 mating with main chassis 190 disposed therebelow. The cavity 158 is formed between the mounting plate 155 and the main chassis 190, intersecting part of the vertical wall 318. The cavity 158 may be in form of individual spaced apart holes, space, apertures, channels, or in form of a hollow ring circumscribing certain portion of the body 334 of the mounting plate 155, intersecting or without intersecting with the vertical wall 318 defined between the mounting plate 155 and the main chassis 190. It is noted that the cavity 158 may be formed in any places and in any numbers in the mounting plate 155, in the main chassis 190, at the vertical wall 318 defined between the mounting plate 155 and the main chassis 190, or any suitable places in the substrate support 150.

In one embodiment, the cavity 158 may have a width 342 between about 10 mm and about 50 mm and a height 344 between about 10 mm and about 80 mm. In one example, the height 344 of the cavity 158 may be controlled in a manner that the cavity 158 is only formed within the body 334 of the mounting plate 155. In this embodiment, the height 344 of the cavity 158 is between about 10 mm and about 50 mm. In another example, the height 344 of the cavity 158 may be controlled in a range greater than the width of the mounting plate 155 so the cavity 158 may extend outward from the body 334 of the mounting plate 155 further to the ground plate 212, even to the base plate 208 or in an opposite direction to the main chassis 190 as needed.

The cavity 158 formed in or bounded by the mounting plate 155 and the main chassis 190 the substrate support 150 may provide flexibility to implement various hardware sets therein for future use to improve temperature/thermal/RF uniformity across the substrate support 150 and eliminate the likelihood of skew pattern that may possibly be created. In one embodiment, electrodes, RF power electrodes, cooling/heating elements, RF ground path, various light sources, additional lift pins, or other parts may be disposed in the cavity 158 as needed.

Accordingly, an apparatus with a recess and a cavity formed therein for future hardware retrofit and uniformity enhancement, especially at the edge, and methods for controlling the same are provided. The recess and cavity formed in a substrate support may provide flexibility for retrofitting additional hardware sets as to improve edge profile control, temperature/gas distribution profile and RF power or plasma distribution of the substrate support and the substrates being processed thereon. By doing so, uniformity control across the substrate support and the substrates being processed thereon may be advantageously controlled and improved.

While the foregoing is directed to embodiments of the present invention, other and further embodiments of the invention may be devised without departing from the basic scope thereof, and the scope thereof is determined by the claims that follow.

The invention claimed is:

1. A substrate support, comprising:
a supporting body having an outer wall;
a ground path disposed against and bounding the outer wall of the supporting body;
a mounting plate coupled to a lower surface of the supporting body, wherein the mounting plate includes a lip extending outward from the mounting plate defining an upper surface; and
a recess formed at a perimeter of the supporting body above the upper surface of the lip of the mounting plate, the recess on the ground path extending at least partially to the mounting plate, wherein the supporting body comprises:
a substrate supporting plate;
a cooling plate coupled to the substrate supporting plate;
an inlet/outlet plate coupled to the cooling plate; and
a base plate coupled to the inlet and outlet plate.

2. The substrate support of claim 1, further comprising:
a ground plate disposed between the supporting body and the mounting plate.

3. The substrate support of claim 1, further comprising:
a liner disposed between the supporting body and the ground path.

4. The substrate support of claim 1, further comprising:
a main chassis disposed to the mounting plate.

5. The substrate support of claim 1, further comprising:
at least one cavity defined in the mounting plate.

6. The substrate support of claim 4, further comprising:
at least one cavity defined between the mounting plate and the main chassis.

7. The substrate support of claim 1, wherein the ground path disposed in a lower part of the recess above an upper surface of the lip.

8. The substrate support of claim 1, wherein the recess has a width between about 5 mm and about 30 mm.

9. The substrate support of claim 5, wherein the cavity has a width between about 10 mm and about 50 mm.

10. The substrate support of claim 5, wherein the cavity has a height between about 10 mm and about 80 mm.

11. The substrate support of claim 5, wherein the cavity is configured to receive an electrode, a RF electrode, cooling or heating elements, a RF ground path, magnets, coils, light sources or lift pins to be disposed therein.

12. The substrate support of claim 1, wherein the recess circumscribes the perimeter of the supporting body above the lip of the mounting plate.

13. The substrate support of claim 1, wherein the recess is configured to receive an electrode, a RF power electrode, a ground path, heating elements, cooling elements, coil, magnetic wires, or light sources to be disposed therein.

14. A substrate support, comprising:
a supporting body;
a mounting plate coupled to the supporting body; and
at least one cavity defined in the mounting plate extending at least partially into a main chassis coupled to the supporting body, wherein the cavity is formed in a position in the mounting plate outward from lift pins disposed in the mounting plate, wherein the supporting body comprises:
a substrate supporting plate;
a cooling plate coupled to the substrate supporting plate;
an inlet/outlet plate coupled to the cooling plate; and
a base plate coupled to the inlet and outlet plate.

15. The substrate support of claim 14, wherein the cavity is in form of individual spaced apart holes, space, apertures, channels.

16. The substrate support of claim 14, wherein the cavity is formed at an interface defined between the mounting plate and the main chassis.

17. The substrate support of claim 14, wherein the cavity has a width between about 10 mm and about 50 mm.

18. The substrate support of claim 14, wherein the cavity is configured to receive an electrode, a RF electrode, cooling or heating elements, a RF ground path, magnets, coils, light sources or lift pins to be disposed therein.

19. A substrate support, comprising:
a supporting body;
a ground plate coupled to the supporting body;
a mounting plate coupled to the ground plate, wherein the mounting plate has a lip extending outward from the mounting plate, defining a recess above the lip of the mounting plate circumscribing the supporting body and the ground plate; and
at least one cavity formed between the mounting plate and a main chassis coupled to the mounting plate, wherein the supporting body comprises:
a substrate supporting plate;
a cooling plate coupled to the substrate supporting plate;
an inlet/outlet plate coupled to the cooling plate; and
a base plate coupled to the inlet and outlet plate.

20. The substrate support of claim 19, further comprising:
a ground path disposed in the recess.

* * * * *